(12) United States Patent
Moriie

(10) Patent No.: US 7,446,413 B2
(45) Date of Patent: Nov. 4, 2008

(54) CIRCUIT APPARATUS AND METHOD FOR OPERATING THE SAME

(75) Inventor: Yoshihiro Moriie, Kashihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 668 days.

(21) Appl. No.: 10/514,237

(22) PCT Filed: May 16, 2003

(86) PCT No.: PCT/JP03/06133

§ 371 (c)(1),
(2), (4) Date: Nov. 19, 2004

(87) PCT Pub. No.: WO01/86654

PCT Pub. Date: Nov. 15, 2001

(65) Prior Publication Data

US 2006/0186945 A1     Aug. 24, 2006

(30) Foreign Application Priority Data

May 21, 2002  (JP) ............... 2002-145820
May 14, 2003  (JP) ............... 2003-135510

(51) Int. Cl.
*H01L 23/34* (2006.01)
(52) U.S. Cl. .................. 257/723; 365/233.1
(58) Field of Classification Search ........... 257/734, 257/697, 698; 365/233.1, 52
See application file for complete search history.

(56) References Cited

U.S. PATENT DOCUMENTS

| 5,623,548 | A  | 4/1997  | Akiyama et al. |
| 6,195,752 | B1 | 2/2001  | Pfab |
| 2002/0159592 | A1 | 10/2002 | Matsushima et al. |
| 2003/0037247 | A1 | 2/2003  | Obara et al. |

FOREIGN PATENT DOCUMENTS

| EP | 0114522 | 8/1984 |
| EP | 0929040 | 7/1999 |
| EP | 0994599 | 4/2000 |
| GB | 2315575 | 4/1998 |
| JP | 56-085169 | 7/1981 |
| JP | 56-118445 | 9/1981 |

(Continued)

OTHER PUBLICATIONS

Tujii et al., "Cryptography and Information Security", pp. 149-158. together with a partial English language translation of the same.

(Continued)

*Primary Examiner*—Roy K Potter
(74) *Attorney, Agent, or Firm*—Greenblum & Bernstein, P.L.C.

(57) ABSTRACT

An LSI includes an operational unit and a switching circuit, and an LSI includes an operational unit and a switching circuit. The operational unit of the LSI generates a switching control signal based on a switching table for supply to the switching circuit. In the switching circuit, each of terminals is connected to any of terminals based on the switching control signal. The operational unit of the LSI generates a switching control signal based on a switching table for supply to the switching circuit. In the switching circuit, each of terminals is connected to any of terminals based on the switching control signal.

15 Claims, 12 Drawing Sheets

FOREIGN PATENT DOCUMENTS

| | | |
|---|---|---|
| JP | 59-139200 | 8/1984 |
| JP | 61-228542 | 10/1986 |
| JP | 62-151930 | 7/1987 |
| JP | 62-169540 | 7/1987 |
| JP | 62-236054 | 10/1987 |
| JP | 62-239636 | 10/1987 |
| JP | 63-155234 | 6/1988 |
| JP | 64-86393 | 3/1989 |
| JP | 3-147597 | 6/1991 |
| JP | 5-120146 | 5/1993 |
| JP | 8-221977 | 8/1996 |
| JP | 8-227269 | 9/1996 |
| JP | 11-024998 | 1/1999 |
| JP | 11-175404 | 7/1999 |
| JP | 11-355265 | 12/1999 |
| JP | 2000-56963 | 2/2000 |
| JP | 2000-504137 | 4/2000 |
| JP | 2002-084270 | 3/2002 |
| JP | 2003-533112 | 11/2003 |
| KR | 19980010802 | 4/1998 |
| WO | 01/86654 | 11/2001 |

OTHER PUBLICATIONS

"5C Digital Transmission Content Protection White Paper", Jul. 14, 1998, retrieved on Mar. 3, 2004 for http://www.dtcp.com/data/wp_spec.pdf.
English Language Abstract of JP 8-221977.
English Language Abstract of JP 63-155234.
English Language Abstract of JP 2000-056963.
English Language Abstract of JP 3-147597.
English Language Abstract of JP 61-228542.
English Language Abstract of JP 2002-84270.
English Language Abstract of JP 11-355265.
English Language Abstract of JP 64-086393.
English language Abstract of JP 56-085169.
English language Abstract of JP 11-024998.
English language partial translation of JP 56-118445 U.
English language Abstract of JP 11-175404.
English language Abstract of JP 62-236054.
English language Abstract of JP 8-227269.
English language Abstract of JP5-120146.
English language Abstract of JP 62-239636.
English language Abstract of JP 62-169540.

F I G. 1 0
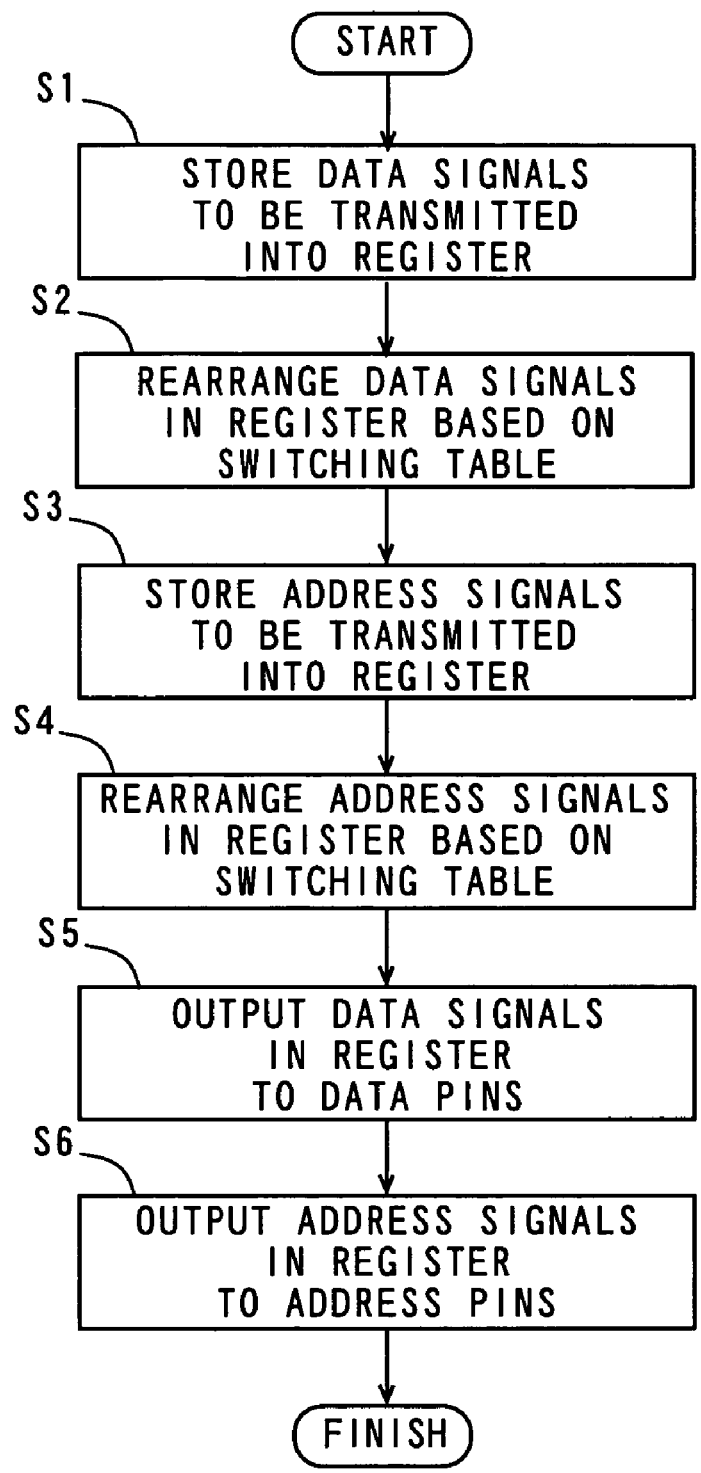

CIRCUIT APPARATUS AND METHOD FOR OPERATING THE SAME

TECHNICAL FIELD

The present invention relates to a circuit device comprising a plurality of interconnected semiconductor integrated circuits and an operation method therefor.

BACKGROUND ART

A variety of circuit devices employ a variety of semiconductor integrated circuits, such as LSIs (Large Scale Integrated Circuits) or VLSIs (Very Large Scale Integrated Circuits). The semiconductor integrated circuits each include a data bus for transmitting data signals and an address bus for transmitting address signals, and also have a plurality of data pins connected to the data bus and a plurality of address pins connected to the address bus.

When a plurality of semiconductor integrated circuits are interconnected in use, data pins are connected to corresponding data pins, and address pins are connected to corresponding address pins among the plurality of semiconductor integrated circuits.

A semiconductor storage has recently been proposed, which provides a selective connection of each external pin to an address bus, data bus, or control bus, by means of a switching circuit (refer to JP 8-221977 A, for example). This allows the function of each external pin to change.

If a third party knows the arrangement of data pins in each of a plurality of interconnected semiconductor integrated circuits, the person can pull out data signals on a data bus using a commercially available tool, to easily load into another storage. This makes it difficult to ensure data security. Digital video or audio data in particular do not degrade in quality by duplication, and therefore, it is easy to illegally copy high-quality video or audio data.

DISCLOSURE OF INVENTION

It is an object of the present invention to provide a circuit device and an operation method therefor in which provision is made to prevent signals from illegally pulled out.

A circuit device according to one aspect of the present invention comprises: a first semiconductor integrated circuit that has a plurality of first signal pins receiving a plurality of signals of the same kind, and includes a first circuit performing processing with respect to the plurality of signals; and a second semiconductor integrated circuit that has a plurality of second signal pins receiving the plurality of signals, and includes a second circuit performing processing with respect to the plurality of signals, wherein the plurality of first signal pins and the plurality of second signal pins are interconnected, and the first semiconductor integrated circuit further includes a first correlation changing unit that changes a correlation between the plurality of signals in the first circuit and the plurality of first signal pins.

In the circuit device according to the invention, the plurality of signals of the same kind are transmitted between the first circuit and the plurality of first signal pins in the first semiconductor integrated circuit, and the plurality of signals of the same kind are transmitted between the second circuit and the plurality of second signal pins in the second semiconductor integrated circuit. Also, the plurality of signals of the same kind are transmitted between the plurality of first signal pins in the first semiconductor integrated circuit and the plurality of second signal pins in the second semiconductor integrated circuit.

In this case, the correlation between the plurality of signals in the first circuit and the plurality of first signal pins is changed by the first correlation changing unit. This causes the arrangement of the plurality of signals on the plurality of first signal pins and on the plurality of second signal pins to be different from the arrangement of the plurality of signals in the first circuit. Thus, a third party is prevented from illegally pulling out the plurality of signals in the first circuit from the plurality of first signal pins or plurality of second signal pins. As a result, the security of the plurality of signals in the first circuit is ensured.

The plurality of signals may be data signals, the plurality of first signal pins may be a plurality of first data pins, and the plurality of second signal pins may be a plurality of second data pins.

In this case, the correlation between the plurality of data signals in the first circuit and the plurality of first data pins is changed by the first correlation changing unit. This causes the arrangement of the plurality of data signals on the plurality of first data pins and on the plurality of second data pins to be different from the arrangement of the plurality of data signals in the first circuit. Thus, the third party is prevented from illegally pulling out the plurality of data signals in the first circuit from the plurality of first data pins or plurality of second data pins. As a result, the security of the plurality of data signals in the first circuit is ensured.

The plurality of signals of the same kind may be address signals, the plurality of first signal pins may be a plurality of first address pins, and the plurality of second signal pins may be a plurality of second address pins.

In this case, the correlation between the plurality of address signals in the first circuit and the plurality of first address pins is changed by the first correlation changing unit. This causes the arrangement of the plurality of address signals on the plurality of first address pins and on the plurality of second address pins to be different from the arrangement of the plurality of address signals in the first circuit. Thus, the third party is prevented from illegally pulling out the plurality of address signals in the first circuit from the plurality of first address pins or plurality of second address pins. As a result, the security of the plurality of address signals in the first circuit is secured.

The plurality of signals may be a plurality of data signals and a plurality of address signals, the plurality of first signal pins may be a plurality of first data pins and a plurality of first address pins, the plurality of second signal pins may be a plurality of second data pins and a plurality of second address pins, the plurality of first data pins and the plurality of second data pins may be interconnected, while the plurality of first address pins and the plurality of second address pins may be interconnected, and the first correlation changing unit may change a correlation between the plurality of first data signals in the first circuit and the plurality of first data pins and a correlation between the plurality of first address signals in the first circuit and the plurality of first address pins.

In this case, the correlation between the plurality of data signals in the first circuit and the plurality of first data pins and the correlation between the plurality of address signals and the plurality of first address pins are changed by the first correlation changing unit. This causes the arrangement of the plurality of data signals on the plurality of first data pins and on the plurality of second data pins to be different from the arrangement of the plurality of data signals in the first circuit. Also, the arrangement of the plurality of address signals on the plurality of first address pins and on the plurality of second address pins is different from the arrangement of the plurality of address signals in the first circuit.

Thus, the third party is prevented from illegally pulling out the plurality of data signals in the first circuit from the plurality of first data pins or plurality of second data pins. As a result, the security of the plurality of data signals in the first circuit is ensured. In addition, the third party is prevented from illegally pulling out the plurality of address signals in the first circuit from the plurality of first address pins or plurality of second address pins. As a result, the security of the plurality of address signals in the first circuit is ensured.

The first correlation changing unit may change a correlation between the plurality of signals in the first circuit and the plurality of first signal pins based on alteration information.

In this case, the correlation between the plurality of signals in the first circuit and the plurality of first signal pins can be arbitrarily changed by arbitrarily setting the alteration information.

The first correlation changing unit may change a correlation between the plurality of signals in the first circuit and the plurality of first signal pins based on the alteration information that differs on a regular or irregular basis.

In this case, the correlation between the plurality of signals in the first circuit and the plurality of first signal pins is changed on a regular or irregular basis, which prevents the third party from easily reading the correlation between the plurality of signals in the first circuit and the plurality of first signal pins.

The circuit device may further comprise a third semiconductor circuit that transmits the alteration information, the first correlation changing unit changing a correlation between the plurality of signals in the first circuit and the plurality of first signal pins based on the alteration information transmitted by the third semiconductor integrated circuit.

In this case, the correlation between the plurality of signals in the first circuit and the plurality of first signal pins can be arbitrarily changed by the transmission of arbitral alteration information by means of the third semiconductor integrated circuit.

The third semiconductor integrated circuit may perform an authentication operation before transmitting the alteration information. This prevents the third party from illegally reading the alteration information transmitted from the third semiconductor integrated circuit.

The first semiconductor integrated circuit may be provided with identification information in advance, and the third semiconductor integrated circuit may request the transmission of identification information to perform the authentication operation based on the identification information transmitted.

In this case, by means of the authentication operation based on the identification information, it can be determined whether or not the third semiconductor integrated circuit is being connected with an unauthorized circuit.

The third semiconductor integrated circuit may transmit the alteration information via a signal line to perform the authentication information based on voltage on the signal line.

In this case, by means of the authentication operation based on voltage on the signal line, it can be determined whether or not the third semiconductor integrated circuit is being connected with an unauthorized circuit.

The first semiconductor circuit may further include a first storage that stores the alteration information, the first correlation changing unit changing a correlation between the plurality of signals in the first circuit and the plurality of first signal pins based on the alteration information stored in the first storage.

In this case, since the alteration information is stored in the first storage, the correlation between the plurality of signals in the first circuit and the plurality of first signal pins can be changed without having to supply the alteration information to the first semiconductor integrated circuit.

The first circuit may produce the alteration information, the first correlation changing unit changing a correlation between the plurality of signals in the first circuit and the plurality of first signal pins based on the alteration information produced by the first circuit.

In this case, since the alteration information is produced by the first circuit, the correlation between the plurality of signals in the first circuit and the plurality of first signal pins can be changed without having to supply the alteration information to the first semiconductor integrated circuit.

The alteration information may be encrypted in advance, and the first correlation changing unit may decrypt the encrypted alteration information to change a correlation between the plurality of signals in the first circuit and the plurality of first signal pins based on the decrypted alteration information.

In this case, the third party is prevented from easily reading the alteration information.

The second semiconductor integrated circuit may further include a second correlation changing unit that changes a correlation between the plurality of signals in the second circuit and the plurality of second signal pins.

In this case, the correlation between the plurality of signals in the first circuit and the plurality of first signal pins is changed by the first correlation changing unit, while the correlation between the plurality of signals in the second circuit and the plurality of second signal pins is changed by the second correlation changing unit.

This causes the arrangement of the plurality of signals on the plurality of first signal pins and on the plurality of second signal pins to be different from the arrangements of the plurality of signals in the first circuit and in the second circuit. Thus, even if the third party pulls out the plurality of signals from the plurality of first signal pins or plurality of second signal pins, the security of the plurality of signals in the first circuit and in the second circuit is ensured.

The second correlation changing unit may change a correlation between the plurality of signals in the second circuit and the plurality of second signal pins based on the alteration information.

In this case, the correlation between the plurality of signals in the first circuit and the plurality of first signal pins and the correlation between the plurality of signals in the second circuit and the plurality of second signal pins can be arbitrarily changed by arbitrarily setting the alteration information.

The second semiconductor integrated circuit may further comprise a second storage that stores the alteration information, and the second correlation changing unit may change a correlation between the plurality of signals in the second circuit and the plurality of second signal pins based on the alteration information stored in the second storage.

In this case, since the alteration information is stored in the second storage, the correlation between the plurality of signals in the second circuit and the plurality of second signal pins can be changed without having to supply the alteration information to the second semiconductor integrated circuit.

The second circuit may produce the alteration information, and the second correlation changing unit may change a correlation between the plurality of signals in the second circuit and the plurality of second signal pins based on the alteration information produced by the second circuit.

In this case, since the alteration information is produced by the second circuit, the correlation between the plurality of signals in the second circuit and the plurality of second signal pins can be changed without having to supply the alteration information to the second semiconductor integrated circuit.

The first semiconductor integrated circuit may transmit the alteration information to the second semiconductor integrated circuit, and the second correlation changing unit may change a correlation between the plurality of signals in the second circuit and the plurality of second signal pins based on the alteration information transmitted by the first semiconductor integrated circuit.

In this case, since the alteration information is transmitted from the first semiconductor integrated circuit to the second semiconductor integrated circuit, the correlation between the plurality of signals in the second circuit and the plurality of second signal pins can be changed without having to supply or store the alteration information to the second semiconductor integrated circuit.

The first correlation changing unit may include: a plurality of first terminals connected to the first circuit; a plurality of second terminals connected to the plurality of first signal pins; and a switching circuit that changes a connection state between the plurality of first terminals and the plurality of second terminals.

In this case, changing the connection state between the plurality of first terminals and the plurality of second terminals in the switching circuit causes the correlation between the plurality of signals in the first circuit and the plurality of first signal pins to change.

The first correlation changing unit may include a program for rearranging the plurality of signals for use in the processing by the first circuit.

In this case, the plurality of signals for use in the processing by the first circuit are rearranged by means of the program, so that the correlation between the plurality of signals in the first circuit and the plurality of first signal pins is changed.

An operation method according to another aspect of the present invention for a circuit device comprising first and second interconnected semiconductor integrated circuits, comprises the steps of: transmitting a plurality of signals of the same kind between a plurality of first signal pins and a first circuit in the first semiconductor integrated circuit; transmitting the plurality of signals between a plurality of second signal pins and a second circuit in the second semiconductor integrated circuit; transmitting the plurality of signals between the plurality of first signal pins and the plurality of second signal pins; and changing a correlation between the plurality of signals in the first circuit and the plurality of first signal pins.

In the operation method for a circuit device according to the present invention, the plurality of signals of the same kind are transmitted between the first circuit and the plurality of first signal pins in the first semiconductor integrated circuit, and the plurality of signals of the same kind are transmitted between the second circuit and the plurality of second signal pins in the second semiconductor integrated circuit. Also, the plurality of signals of the same kind are transmitted between the plurality of first signal pins in the first semiconductor integrated circuit and the plurality of second signal pins in the second semiconductor integrated circuit.

In this case, the correlation between the plurality of signals in the first circuit and the plurality of first signal pins is changed. This causes the arrangement of the plurality of signals on the plurality of first signal pins and on the plurality of second signal pins to be different from the arrangement of the plurality of signals in the first circuit. The third party is thus prevented from illegally pulling out the plurality of signals in the first circuit from the plurality of first signal pins or the plurality of second signal pins. As a result, the security of the plurality of signals in the first circuit is ensured.

BRIEF DESCRIPTION OF DRAWINGS

FIG. 10 is a flowchart showing an example of the operation of transmitting data signals by the operational unit of an LSI in the semiconductor integrated circuit of FIG. 9;

BEST MODE FOR CARRYING OUT THE INVENTION (1) First Embodiment

Figure 1:
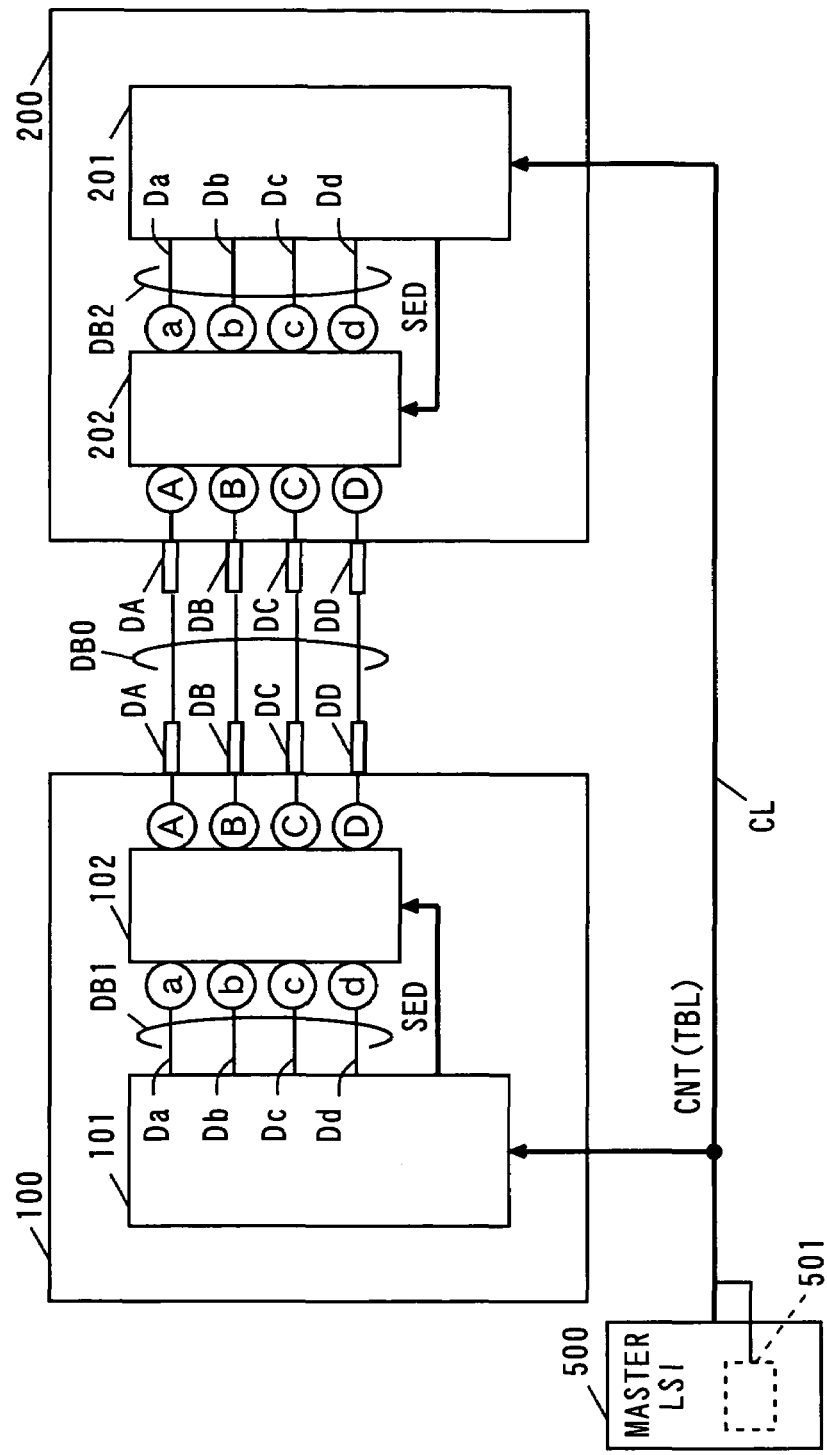
FIG. 1 is a block diagram showing the configuration of a semiconductor integrated circuit according to a first embodiment of the present invention.

FIG. 1 is a block diagram showing the configuration of a circuit device according to a first embodiment of the present invention.

The circuit device shown in FIG. 1 comprises an LSI 100, an LSI 200, and a master LSI 500. The LSI 100, LSI 200, and master LSI 500 may be provided in one apparatus or each in a separate apparatus.

The LSI 100 includes an operational unit 101 and a switching circuit 102, and also has data pins DA, DB, DC, DD. The operational unit 101 performs various processings in accordance with a predetermined program. The operational unit 101 is connected with an internal data bus DB1 that transmits data signals. The internal data bus DB1 includes a plurality of serial data lines, Da, Db, Dc, Dd. In this embodiment, the internal data bus DB1 has a width of four bits. The switching circuit 102 has terminals a, b, c, d, and terminals A, B, C, D.

The terminals a-d of the switching circuit 102 are connected to the data lines Da-Dd, respectively. The terminals A-D of the switching circuit 102 are connected to the data pins DA-DD, respectively.

The LSI 200 includes an operational unit 201 and a switching circuit 202, and also has data pins DA, DB, DC, DD. The operational unit 201 performs various processings in accordance with a predetermined program. The operational unit 201 is connected with an internal data bus DB2 that transmits data signals. The internal data bus DB2 includes a plurality of serial data lines Da, Db, Dc, Dd. In this embodiment, the internal data bus DB2 has a width of four bits. The switching circuit 202 has terminals a, b, c, d, and terminals A, B, C, D. The terminals a-d of the switching circuit 202 are connected to the data lines Da-Dd, respectively. The terminals A-D of the switching circuit 202 are connected to the data pins DA-DD, respectively.

The data pins DA-DD in the LSI 100 and the data pins DA-DD in the LSI 200 are interconnected via an external data bus DB0.

The data signals processed by the LSIs 100, 200 are video data signals, audio data signals, or the like, although any kind of data signals may be used other than those above.

The master LSI 500 is composed of a microcomputer, for example. The master LSI 500 supplies a control signal CNT via a control signal line CL to the operational unit 101 in the LSI 100 and to the operational unit 201 in the LSI 200. The control signal CNT includes a switching table TBL to be described below. The operational unit 101 generates a switching control signal SED for switching the switching circuit 102 based on the switching table TBL supplied from the master LSI 500. The operational unit 201 generates a switching control signal SED for switching the switching circuit 202 based on the switching table TBL supplied from the master LSI 500. The switching table TBL as used herein indicates a connection state between the terminals a-d and the terminals A-D in each of the switching circuits 102, 202.

The master LSI 500 incorporates a voltage sensor circuit 501 that detects a decrease in the voltage on the control signal line CL.

Figure 2:
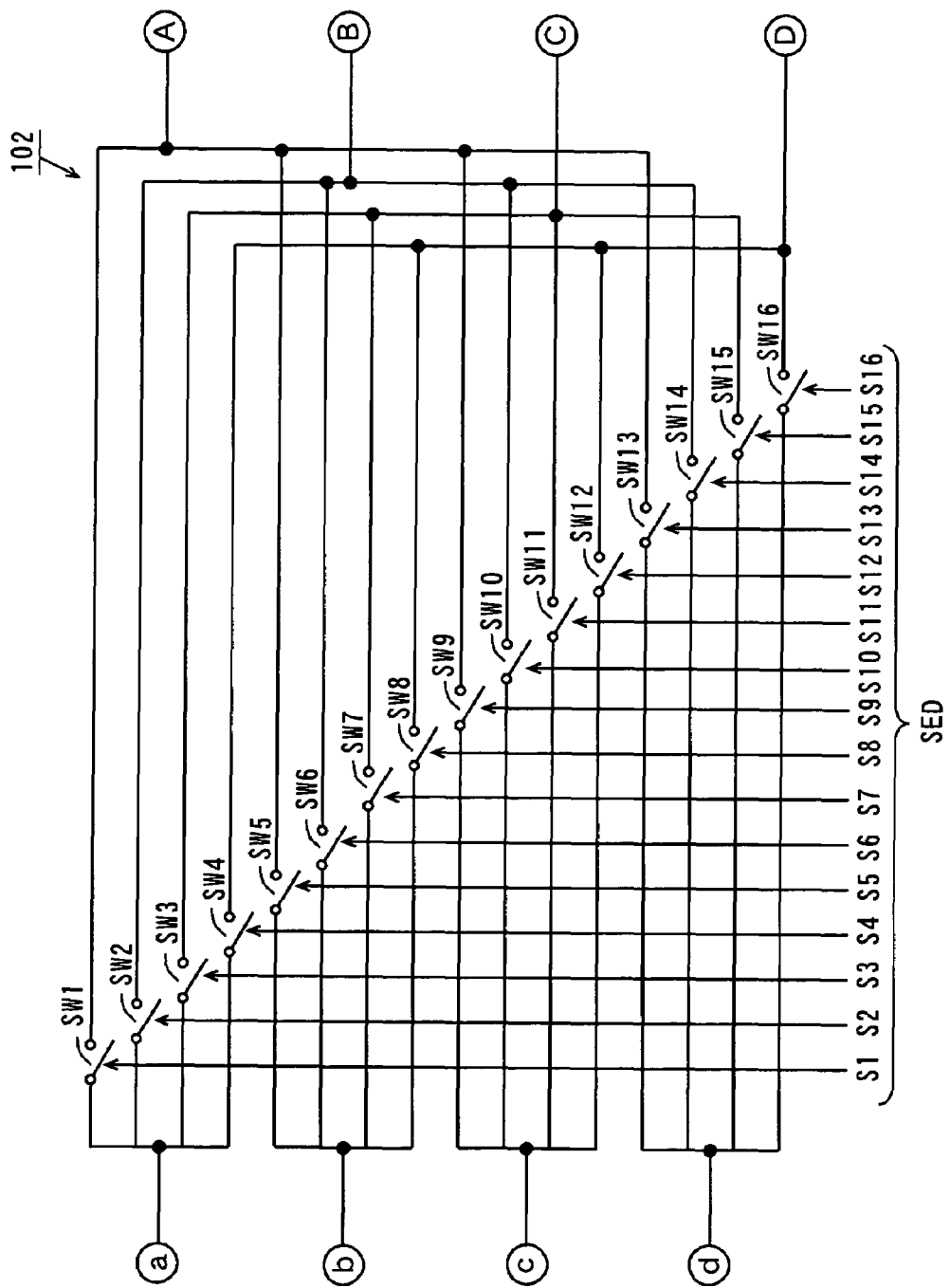
FIG. 2 is a circuit diagram showing an example of the switching circuit of FIG. 1.

FIG. 2 is a circuit diagram showing an example of the configuration of the switching circuit 102 of FIG. 1. The configuration of the switching circuit 202 of FIG. 1 is similar to that of the switching circuit 102 of FIG. 2.

As shown in FIG. 2, the switching circuit 102 comprises a plurality of switches SW1 to SW16. In this embodiment, the switching circuit 102 comprises the sixteen switches SW1 to SW16. The terminal a is connected via the switches SW1-SW4 to the terminals A-D, respectively. The terminal b is connected via the switches SW5-SW8 to the terminals A-D, respectively. The terminal c is connected via the switches SW9-SW12 to the terminals A-D, respectively. The terminal d is connected via the switches SW13-SW16 to the terminals A-D, respectively.

The switches SW1-SW16 receive on/off control signals S1-S16, respectively. The switches SW1-SW16 are turned on or off in response to the on/off control signals S1-S16, respectively. The on/off control signals S1-S16 form the switching control signal SED. The switches SW1-SW16 are switched so that each of the terminals a-d and each of the terminals A-D correspond one-to-one with each other in response to the switching control signal SED.

The operation of the circuit device of FIG. 1 is now described. First, the master LSI 500 supplies via the control signal line CL the control signal CNT including the switching table TBL to the operational unit 101 in the LSI 100 and to the operational unit 201 in the LSI 200. The operational unit 101 generates the switching control signal SED based on the switching table TBL for supply to the switching circuit 102. In the switching circuit 102, each of the terminals a-d is connected to any of the terminals A-D based on the switching control signal SED. Similarly, the operational unit 201 generates the switching control signal SED based on the switching table TBL for supply to the switching circuit 202. In the switching circuit 202, each of the terminals a-d is connected to any of the terminals A-D based on the switching control signal SED.

For transmission of data signals from the LSI 100 to the LSI 200, the data signals output from the operational unit 101 in the LSI 100 to the internal data bus DB1 are input via the switching circuit 102, data pins DA-DD in the LSI 100, external data bus DB0, data pins DA-DD in the LSI 200, the switching circuit 202, and data bus DB2 to the operational unit 201 in the LIS 200.

For transmission of the data signals from the LSI 200 to the LSI 100, the data signals output from the operational unit 201 in the LSI 200 to the internal data bus DB2 are input via the switching circuit 202, data pins DA-DD in the LSI 200, external data bus DB0, data pins DA-DD in the LSI 100, switching circuit 102, and internal data bus DB1 to the operational unit 101 in the LSI 100.

In this manner, based on the switching table TBL supplied from the master LSI 500, the connection state between the terminals a-d and the terminals A-D in the switching circuit 102 and the connection state between the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Thus, the security of the data signals on the internal data buses DB1, DB2 can be ensured, even if a third party pulls out the data signals from the data pins DA-DD in the LSI 100 or LSI 200.

Alternatively, the master LSI 500 may supply an encrypted switching table TBL via the control signal line CL to the operational unit 101 in the LSI 100 and to the operational unit 201 in the LSI 200. In this case, the operational units 101, 201 are provided in advance with a key for decrypting the cryptography. The operational units 101, 201 generate switching control signals SED by decrypting the encrypted switching table TBL using the key provided, for supply to the switching circuits 102, 202. This prevents the third party from easily reading the switching table TBL on the control signal line CL.

The voltage sensor circuit 501 in the master LSI 500 detects whether the voltage on the control signal line CL is decreased by a given value or greater. The voltage on the control signal line CL is decreased when the control signal line CL is illegally connected to another device. Thus, the master LSI 500 authenticates an LSI connected to the control signal line CL based on whether the voltage on the control signal line CL is decreased by a given value or greater. When the voltage sensor circuit 501 detects that the voltage on the control signal line CL is decreased by a given value or greater, the master LSI 500 does not output the switching table TBL to the control signal line CL. This prevents the third party from illegally reading the switching table TBL on the control signal line CL.

Still alternatively, the master LSI 500 may supply, upon initiation or on a regular basis, a different switching table TBL via the control signal line CL to the operational unit 101 in the LSI 100 and to the operational unit 201 in the LSI 200. This prevents the third party from easily reading the connection states of the switching circuits 102, 202.

(2) Second Embodiment

Figure 3:
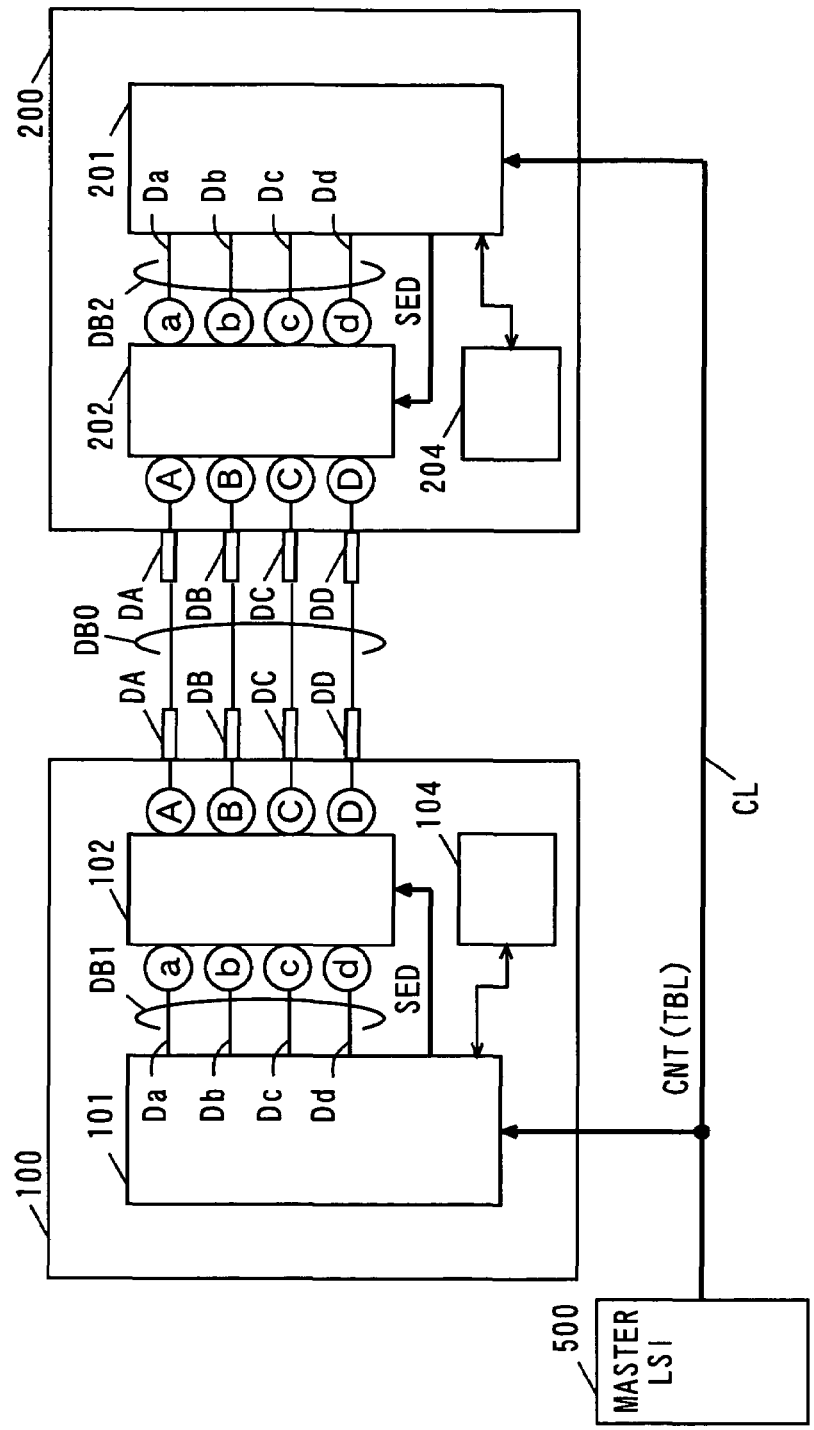
FIG. 3 is a block diagram showing the configuration of a semiconductor integrated circuit according to a second embodiment of the present invention.

FIG. 3 is a block diagram showing the configuration of a circuit device according to a second embodiment.

The circuit device shown in FIG. 3 differs from that of FIG. 1 in that the LSI 100 additionally includes an internal storage 104 composed of a semiconductor memory, and the LSI 200 additionally includes an internal storage 204 composed of a semiconductor memory.

Each of the internal storages 104, 204 contains given identification information stored in advance. First, the master LSI 500 requests the transmission of the identification information from the operational unit 101 in the LSI 100 and from the operational unit 201 in the LSI 200 via the control signal line CL. This causes the operational unit 101 and the operational unit 201 to read the identification information stored in their respective internal storages 104 and 204 for transmission to the master LSI 500 via the control signal line CL. The master LSI 500 authenticates an LSI connected to the control signal line CL based on the identification information received via the control signal line CL. Upon receipt of unauthorized identification information, the master LSI 500 does not output a switching table TBL to the control signal line CL. This prevents the third party from illegally reading the switching table TBL on the control signal line CL.

(3) Third Embodiment

Figure 4:
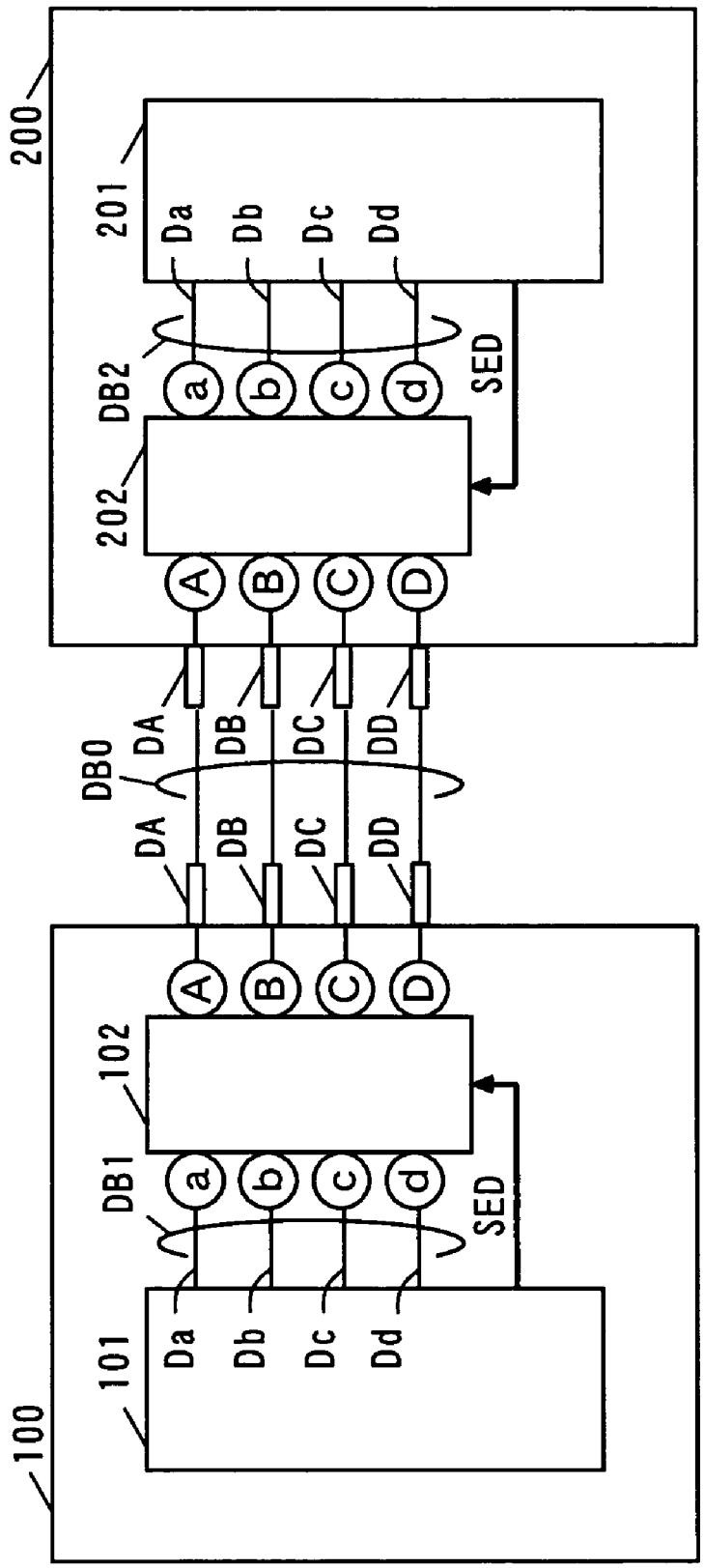
FIG. 4 is a block diagram showing the configuration of a semiconductor integrated circuit according to a third embodiment of the present invention.

FIG. 4 is a block diagram showing the configuration of a circuit device according to a third embodiment of the present invention.

The circuit device shown in FIG. 4 differs from that of FIG. 1 in that it is not provided with the master LSI 500 and the control signal line CL.

The operational unit 101 in the LSI 100 creates a switching table TBL in accordance with a predetermined program, for transmission via the internal data bus DB1, switching circuit 102, data pins DA-DD in the LSI 100, external data bus DB0, data pins DA-DD in the LSI 200, switching circuit 202, and internal data bus DB2 to the operational unit 201 in the LSI 200.

Then, the operational unit 101 in the LSI 100 creates a switching control signal SED based on the switching table TBL for supply to the switching circuit 102. In the switching circuit 102, each of the terminals a-d is connected to any of the terminals A-D based on the switching control signal SED. Similarly, the operational unit 201 in the LSI 200 creates a switching control signal SED based on the received switching table TBL for supply to the switching circuit 202. In the switching circuit 202, each of the terminals a-d is connected to any of the terminals A-D based on the switching control signal SED.

After this, data signals are transmitted or received between the operational unit 102 in the LSI and the operational unit 201 in the LSI 200.

In this manner, based on the switching table TBL created by the operational unit 101 in the LSI 100, the connection state between the terminals a-d and the terminals A-D in the switching circuit 102 and the connection state between the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Thus, the security of the data signals on the internal data buses DB1, DB2 can be ensured, even if the third party pulls out the data signals from the data pins DA-DD in the LSI 100 or LSI 200.

Alternatively, the operational unit may, upon initiation or on a regular basis, create a different switching table TBL. This prevents the third party from easily reading the connection states of the switching circuits 102, 202.

(4) Fourth Embodiment

Figure 5:
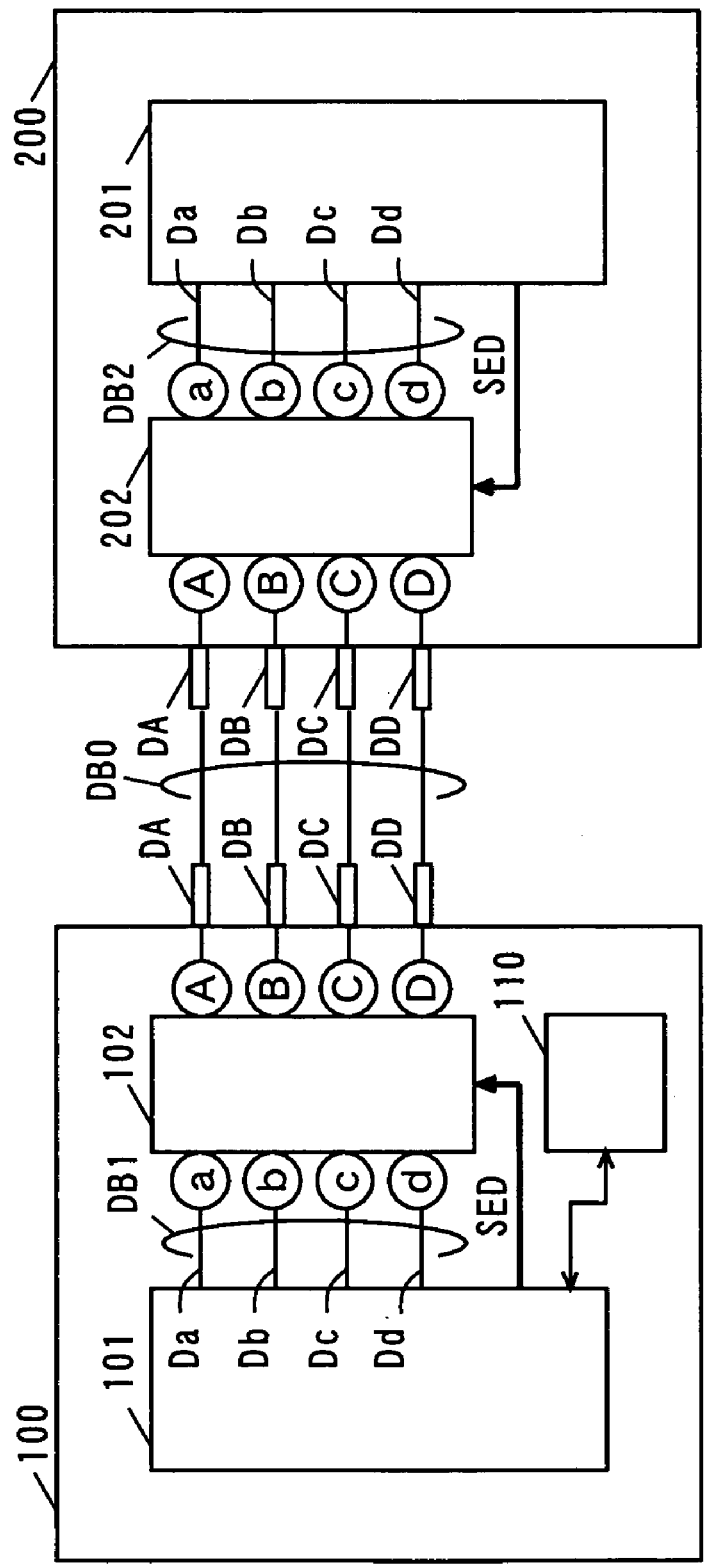
FIG. 5 is a block diagram showing the configuration of a semiconductor integrated circuit according to a fourth embodiment of the present invention.

FIG. 5 is a block diagram showing the configuration of a circuit device according to a fourth embodiment.

The circuit device shown in FIG. 5 differs from that of FIG. 4 in that the LSI 100 additionally includes an internal storage 110 composed of a semiconductor memory.

The internal storage 110 contains a switching table TBL stored in advance. The operational unit 101 in the LSI 100 reads a switching table TBL from the internal storage 110 for transmission via the internal data bus DB1, switching circuit 102, data pins DA-DD in the LSI 100, external data bus DB0, data pins DA-DD in the LSI 200, switching circuit 202, and internal data bus DB2 to the operational unit 201 in the LSI 200.

Then, the operational unit 101 in the LSI 100 generates a switching control signal SED based on the switching table TBL for supply to the switching circuit 102. In the switching circuit 102, each of the terminals a-d is connected to any of the terminals A-D based on the switching control signal SED. Similarly, the operational unit 201 in the LSI 200 generates a switching control signal SED based on the received switching table TBL for supply to the switching circuit 202. In the switching circuit 202, each of the terminals a-d is connected to any of the terminals A-D based on the switching control signal SED.

After this, data signals are transmitted or received between the operational unit 101 in the LSI 100 and the operational unit 201 in the LSI 200.

In this manner, based on the switching table TBL stored in the internal storage 110, the connection state between the terminals a-d and the terminals A-D in the switching circuit 102 and the connection state between the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Thus, the security of the data signals on the internal data buses DB1, DB2 can be ensured, even if the third party pulls out the data signals from the data pins DA-DD in the LSI 100 or LSI 200.

Alternatively, a plurality of different switching tables TBL may be stored in the internal storage 110. In this case, the operational unit 101 is able to read a different switching table TBL from the internal storage 110 upon initiation or on a regular basis. This prevents the third party from easily reading the connection states of the switching circuits 102, 202.

Still alternatively, an encrypted switching table TBL may be stored in the internal storage 110. In this case, the operational unit 101 is provided with a key in advance for decrypting the cryptography. The operational unit 101 generates a switching control signal SED by decrypting the encrypted switching table TBL read from the internal storage 110, using the key provided. This prevents the third party from easily reading the switching table TBL stored in the internal storage 110.

(5) Fifth Embodiment

Figure 6:
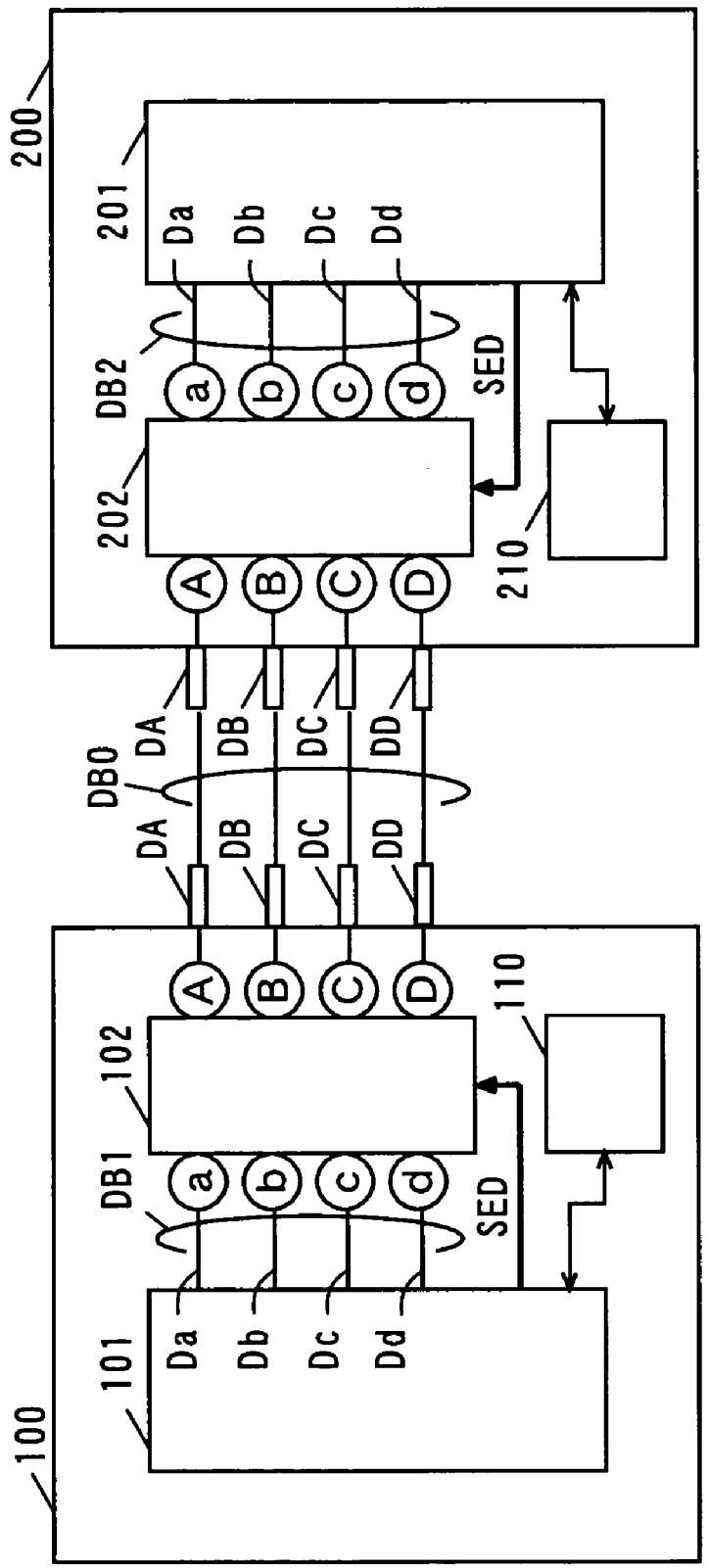
FIG. 6 is a block diagram showing the configuration of a semiconductor integrated circuit according to a fifth embodiment of the present invention.

FIG. 6 is a block diagram showing the configuration of a circuit device according to a fifth embodiment of the present invention.

The circuit device shown in FIG. 6 differs from that of FIG. 5 in that the LSI 200 additionally includes an internal storage 210.

The internal storage 110 and internal storage 210 each contain a switching table TBL stored in advance. The operational unit 101 in the LSI 100 reads the switching table TBL from the internal storage 110 to generate a switching control signal SED based on the switching table TBL for supply to the switching circuit 102. In the switching circuit 102, each of the terminals a-d is connected to any of the terminals A-D based on the switching control signal SED. Similarly, the operational unit 201 in the LSI 200 reads the switching table TBL from the internal storage 210 to generate a switching control signal SED based on the switching table TBL for supply to the switching circuit 202. In the switching circuit 202, each of the terminals a-d is connected to any of the terminals A-D based on the switching control signal SED.

After this, data signals are transmitted or received between the operational unit 101 in the LSI 100 and the operational unit 201 in the LSI 200.

In this manner, based on the switching tables TBL stored in the internal storages 110, 210, the connection state between the terminals a-d and the terminals A-D in the switching circuit 102 and the connection state between the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Thus, the security of the data signals on the internal data buses DB1, DB2 can be ensured, even if the third party pulls out the data signals from the data pins DA-DD in the LSI 100 or LSI 200.

Alternatively, a plurality of different switching tables TBL may be stored in the internal storages 110, 210. In this case, the operational units 101, 201 are able to read a different switching table TBL from the internal storages 110, 210 upon initiation or on a regular basis. This prevents the third party from easily reading the connection states of the switching circuits 102, 202.

Still alternatively, an encrypted switching table TBL may be stored in each of the internal storages 110, 210. In this case, the operational units 101, 201 are each provided in advance with a key for decrypting the cryptography. The operational units 101, 201 generate switching control signals SED by decrypting the encrypted switching tables TBL read from the internal storages 110, 210, using the key provided. This prevents the third party from easily reading the switching tables TBL stored in the internal storages 110, 210.

(6) Sixth Embodiment

Figure 7:
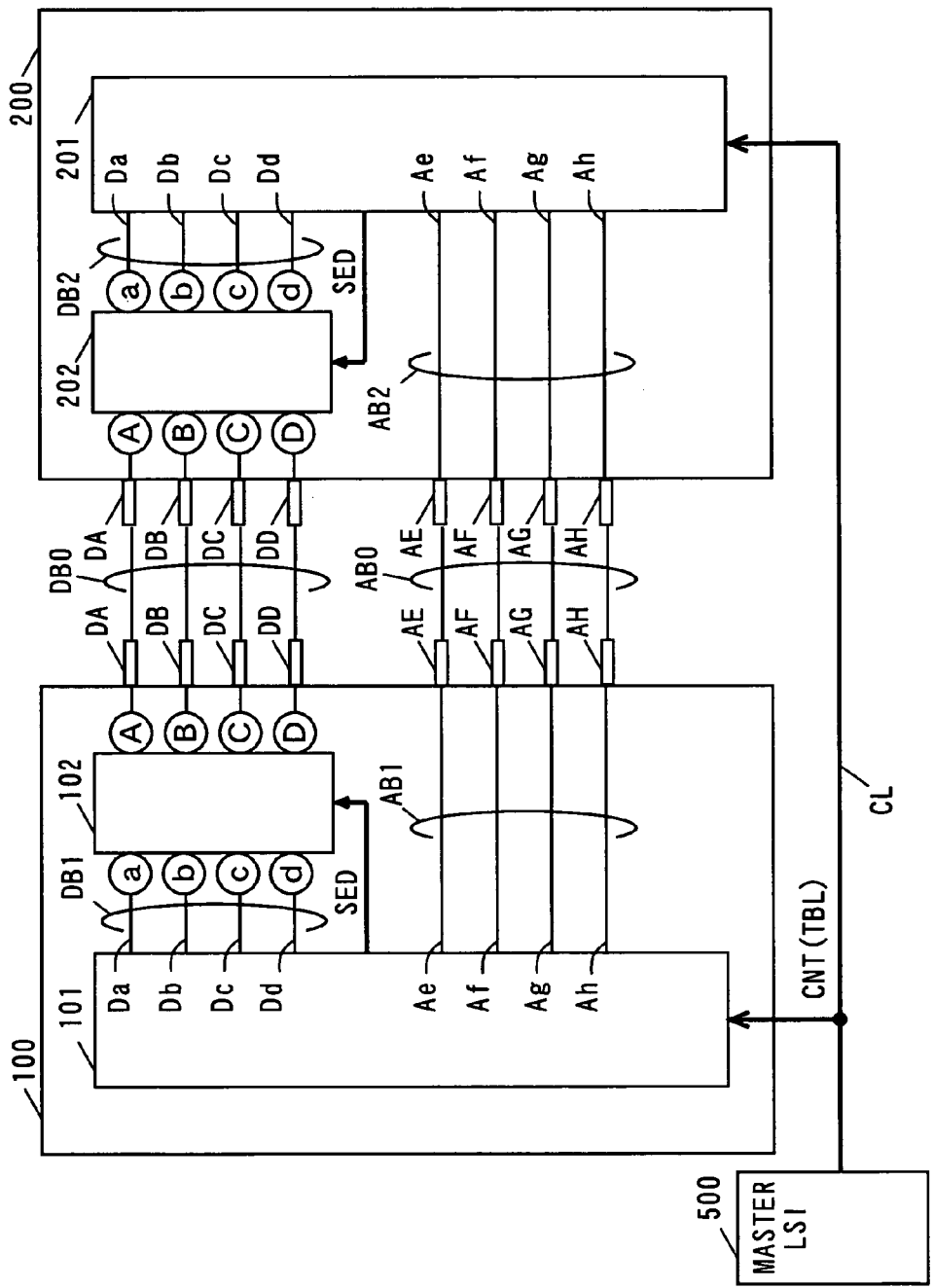
FIG. 7 is a block diagram showing the configuration of a semiconductor integrated circuit according to a sixth embodiment of the present invention.

FIG. 7 is a block diagram showing the configuration of a circuit device according to a sixth embodiment of the present invention.

The circuit device shown in FIG. 7 differs from that of FIG. 1 as follows.

The LSI 100 additionally has address pins AE, AF, AG, AH. The operational unit 101 is connected also with an internal address bus AB1 that transmits address signals. The internal address bus AB1 includes a plurality of serial address lines Ae, Af, Ag, Ah. In this embodiment, the internal address bus AB1 has a width of four bits. The address lines Ae-Ah are connected to the address pins AE-AH, respectively.

The LSI 200 additionally has address pins AE, AF, AG, AH. The operational unit 201 is connected also with an internal address bus AB2 that transmits address signals. The internal address bus AB2 includes a plurality of serial address lines Ae, Af, Ag, Ah. In this embodiment, the internal address bus AB2 has a width of four bits. The address lines Ae-Ah are connected to the address pins AE-AH, respectively.

The address pins AE-AH in the LSI 100 and the address pins AE-AH in the LSI 200 are interconnected via an external address bus AB0.

The operation of the circuit device of FIG. 7 will now be described. First, the master LSI 500 supplies a control signal CNT including a switching table TBL via the control signal line CL to the operational unit 101 in the SLI 100 and to the operational unit 201 in the LSI 200. The operational unit 101 generates a switching control signal SED based on the switching table TBL for supply to the switching circuit 102. In the switching circuit 102, each of the terminals a-d is connected to any of the terminals A-D based on the switching control signal SED. Similarly, the operational unit 201 generates a switching control signal SED based on the switching table TBL for supply to the switching circuit 202. In the switching circuit 202, each of the terminals a-d is connected to any of the terminals A-D based on the switching control signal SED.

After this, data signals are transmitted or received between the operational unit 101 in the LSI 100 and the operational unit 201 in the LSI 200. Concurrently, address signals are transmitted or received between the operational unit 101 in the LSI 100 and the operational unit 201 in the LSI 200.

In this manner, based on the switching table TBL supplied from the master LSI 500, the connection state between the terminals a-d and the terminals A-D in the switching circuit 102 and the connection state between the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Thus, the security of the data signals on the internal data buses DB1, DB2 can be ensured, even if the third party pulls out the data signals from the data pins DA-DD in the LSI 100 or LSI 200.

(7) Seventh Embodiment

Figure 8:
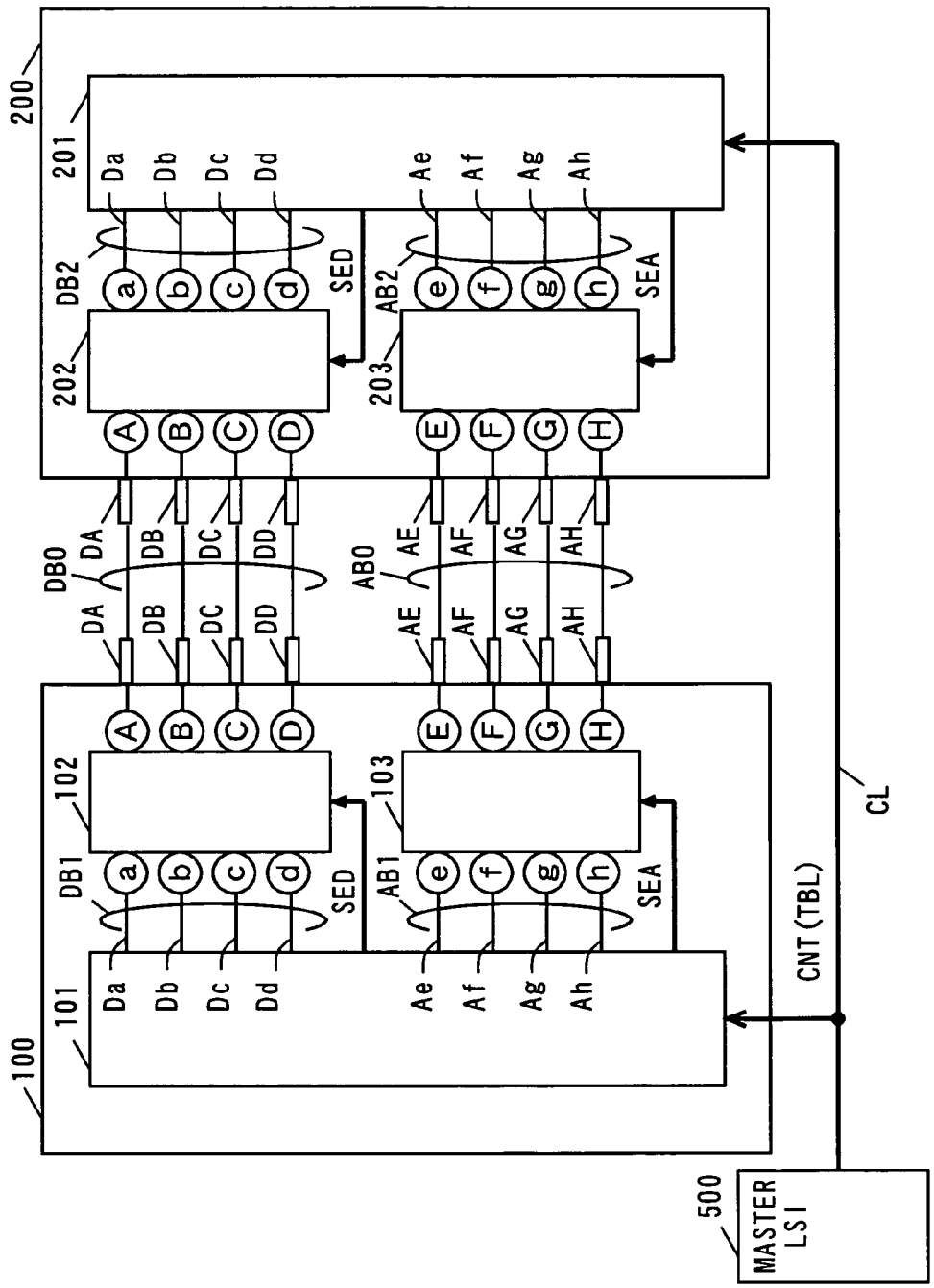
FIG. 8 is a block diagram showing the configuration of a semiconductor integrated circuit according to a seventh embodiment of the present invention.

FIG. 8 is a block diagram showing the configuration of a circuit device according to a seventh embodiment.

The circuit device shown in FIG. 8 differs from that of FIG. 7 in that the LSI 100 additionally includes a switching circuit 103, and the LSI 200 additionally includes a switching circuit 203.

The switching circuit 103 in the LSI 100 has terminals e, f, g, h and terminals E, F, G, H. The terminals e-h of the switching circuit 103 are connected to address lines Ae-Ah, respectively. The terminals E-H of the switching circuit 103 are connected to address pins AE-AH, respectively. The switching circuit 203 in the LSI 200 has terminals e, f, g, h and terminals E, F, G, H. The terminals e-h of the switching circuit 203 are connected to address lines Ae-Ah, respectively. The terminals E-H of the switching circuit 203 are connected to address pins AE-AH, respectively.

The operation of the circuit device of FIG. 8 will now be described. First, the master LSI 500 supplies a control signal CNT including a switching table TBL via the control signal line CL to the operational unit 101 in the LSI 100 and to the operational unit 201 in the LSI 200. The operational unit 101 generates switching control signals SED, SEA based on the switching table TBL for supply to the switching circuits 102, 103, respectively. In the switching circuit 102, each of the terminals a-d is connected to any of the terminals A-D based on the switching control signal SED. In the switching circuit 103, each of the terminals e-h is connected to any of the terminals E-H based on the switching control signal SEA. Similarly, the operational unit 201 generates switching control signals SED, SEA based on the switching table TBL for supply to the switching circuits 202, 203, respectively. In the switching circuit 202, each of the terminals a-d is connected to any of the terminals A-D based on the switching control signal SED. In the switching circuit 203, each of the terminals e-h is connected to any of the terminals E-H based on the switching control signal SEA.

After this, data signals are transmitted or received between the operational unit 101 in the LSI 100 and the operational unit 201 in the LIS 200. Concurrently, address signals are transmitted or received between the operational unit 101 in the LSI 100 and the operational unit 201 in the LIS 200.

In this manner, based on the switching table TBL supplied from the master LSI 500, the connection state between the terminals a-d and the terminals A-D in the switching circuit 102, and the connection state of the terminals a-d and the terminals A-D in the switching circuit 202 can be arbitrarily switched. This allows the data signals on the external data bus DB0 to be different from the data signals on the internal data bus DB1 in the LSI 100 and on the internal data bus DB2 in the LSI 200.

Moreover, based on the switching table TBL, the connection state between the terminals e-h and the terminals E-H in the switching circuit 103, and the connection state between the terminals e-h and the terminals E-H in the switching circuit 203 can be arbitrarily switched. This allows the address signals on the external address bus AB0 to be different from the address signals on the internal address bus AB1 in the LSI 100 and on the internal address bus AB2 in the LSI 200.

Thus, the security of the data signals on the internal data buses DB1, DB2 can be ensured, even if the third party pulls out the data signals from the data pins DA-DD in the LSI 100 or LSI 200. The security of the address signals on the internal address buses AB1, AB2 can also be ensured, even if the third party pulls out the address signals from the address pins AE-AH in the LSI 100 or LSI 200.

(8) Eighth Embodiment

Figure 9:
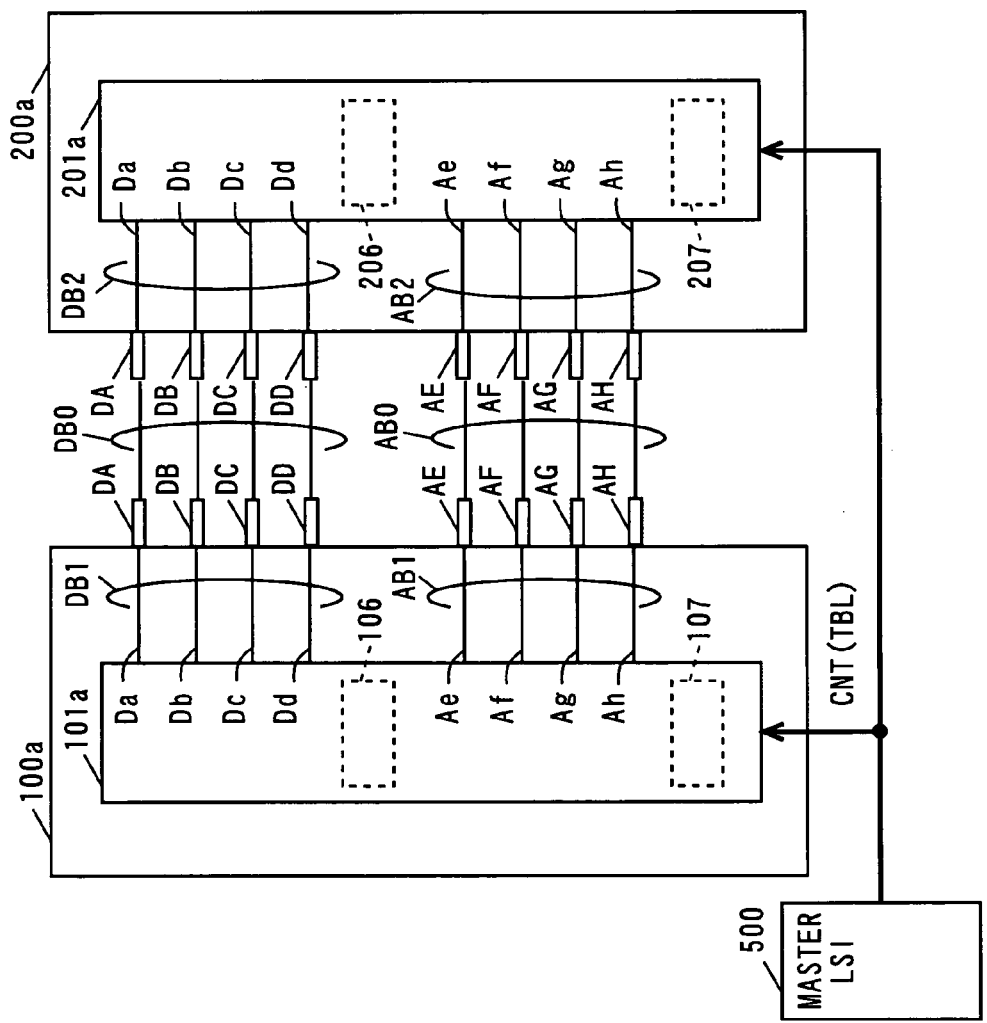
FIG. 9 is a block diagram showing the configuration of a semiconductor integrated circuit according to an eighth embodiment of the present invention.

FIG. 9 is a block diagram showing the configuration of a circuit device according to an eighth embodiment of the present invention.

The circuit device shown in FIG. 9 comprises an LSI 100a, an LSI 200a, and a master LSI 500.

The LSI 100a includes an operational unit 101a, and has data pins DA, DB, DC, DD and address pins AE, AF, AG, AH. The operational unit 101a incorporates a register 106 for rearranging data signals and a register 107 for rearranging address signals. The operational unit 101a is connected with an internal data bus DB1 that transmits data signals and an internal address bus AB1 that transmits address signals. A plurality of data lines Da-Dd of the internal data bus DB1 are connected to the data pins DA-DD, respectively. A plurality of address lines Ae-Ah of the internal address bus AB1 are connected to the address pins AE-AH, respectively.

The LSI 200a includes an operational unit 201a, and has data pins DA, DB, DC, DD and address pins AE, AF, AG, AH. The operational unit 201a incorporates a register 206 for rearranging data signals and a register 207 for rearranging address signals. The operational unit 201a is connected with an internal data bus DB2 that transmits data signals and an internal address bus AB2 that transmits address signals. A plurality of data lines Da-Dd of the internal data bus DB2 are connected to the data pins DA-DD, respectively. A plurality of address lines Ae-Ah of the internal address bus AB2 are connected to the address pins AE-AH, respectively.

Figure 11:
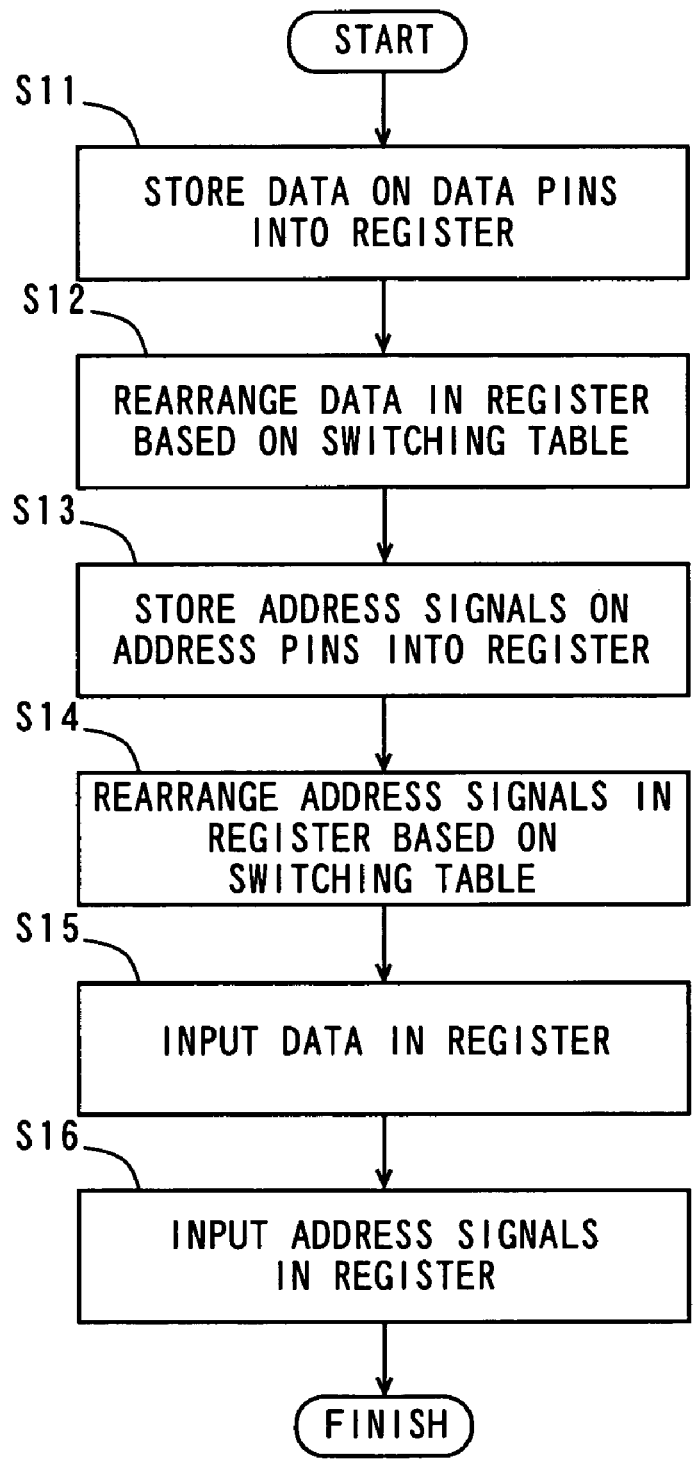
FIG. 11 is a flowchart showing an example of the operation of transmitting data signals by the operational unit of an LSI in the semiconductor integrated circuit of FIG. 9.

The operation of the circuit device of FIG. 9 will now be described with reference to the operation in transmitting data signals from the operational unit 101a in the LSI 100a to the operational unit 201a in the LIS 200a. FIG. 10 is a flowchart showing an example of transmission of data signals by the operational unit 101a of the LSI 100a in the circuit device shown in FIG. 9. FIG. 11 is a flowchart showing an example of reception of data signals by the operational unit 201a of the LSI 200a in the semiconductor integrated circuit shown in FIG. 9.

First, the master LSI 500 supplies a control signal CNT including a switching table TBL via the control signal line CL to the operational unit 101a in the LSI 100a and to the operational unit 201a in the LSI 200a.

As shown in FIG. 10, the operational unit 101a in the LSI 100a stores in the register 106 the data signals to be transmitted (Step S1). Then, the operational unit 101a rearranges the data signals in the register 106 based on the switching table TBL (Step S2).

The operational unit 101a further stores in the register 107 the address signals to be transmitted (Step S3). Then, the operational unit 101a rearranges the address signals in the register 107 based on the switching table TBL (Step S4).

The operational unit 101a subsequently outputs the data signals in the register 106 to the data pins DA-DD (Step S5). The operational unit 101a also outputs the address signals in the register 107 to the address pins AE-AH (Step S6).

As shown in FIG. 11, the operational unit 201a in the LSI 200a stores the data signals on the data pins DA-DD into the register 206 (Step S11). The operational unit 201a also rearranges the data signals in the register 206 based on the switching table TBL (Step S12).

The operational unit 201a stores the address signals on the address pins AE-AH into the register 207 (Step S13). The operational unit 201a also rearranges the address signals in the register 206 based on the switching table TBL (Step S14).

The operational unit 201a inputs the data signals in the register 206 (Step S15). The operational unit 201a also inputs the address signals in the register 207 (Step S16).

In this manner, the data signals are transmitted or received between the operational unit 101a in the LSI 100a and the operational unit 201a in the LSI 200.

Based on the switching table TBL supplied from the master LSI 500, the data signals and address signals to be transmitted from the operational unit 101a in the LSI 100a are rearranged, and the data signals and address signals received at the operational unit 201a in the LSI 200a are rearranged, by means of software, as described above. This allows the data signals on the external data bus DB0 to be different from the data signals processed in the operational unit 101a in the LSI 100a and in the operational unit 201a in the LSI 200a. In addition, the address signals on the external address bus AB0 are different from the address signals processed in the operational unit 101a in the LSI 100a and in the operational unit 201a in the LSI 200a.

Thus, the security of the data signals on the internal data buses DB1, DB2 can be ensured, even if the third party pulls out the data signals from the data pins DA-DD in the LSI 100 or LSI 200. The security of the address signals on the internal address buses AB1, AB2 can also be ensured, even if the third party pulls out the address signals from the address pins AE-AH in the LSI 100*a* or LSI 200*a*.

(9) Ninth Embodiment

Figure 12:
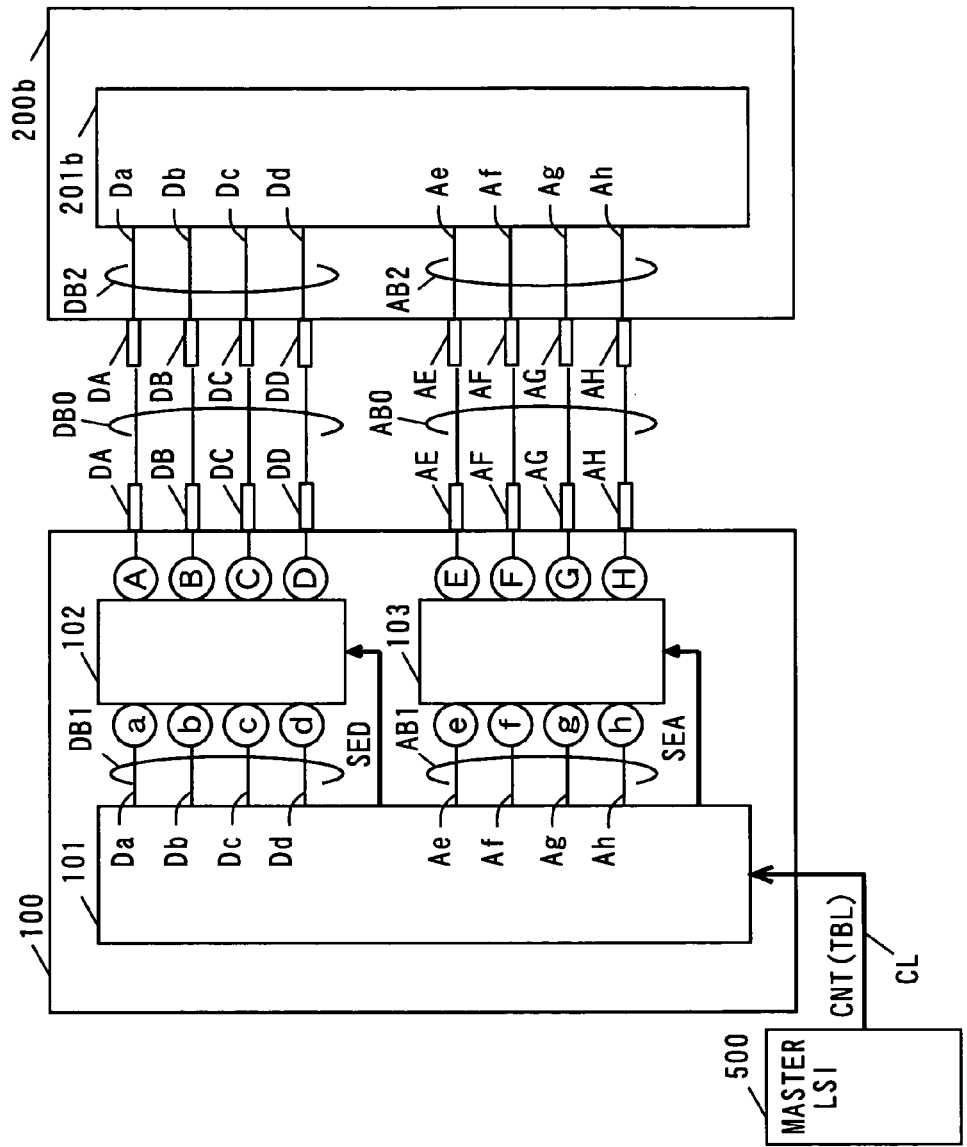
FIG. 12 is a block diagram showing the configuration of a semiconductor integrated circuit according to a ninth embodiment of the present invention.

FIG. 12 is a block diagram showing the configuration of a semiconductor integrated circuit device according to a ninth embodiment of the present invention.

The semiconductor integrated circuit device shown in FIG. 11 differs from that of FIG. 8 in that an LSI 200*b* is provided instead of the LSI 200. The LSI 200*b* includes a semiconductor memory 201*b*.

The semiconductor memory 201*b* is connected with an internal data bus DB2 that transmits data signals. The semiconductor memory 201*b* is also connected with an internal address bus AB2 that transmits address signals. A plurality of data lines Da-Dd of the internal data bus DB2 are connected to data pins DA-DD, respectively. A plurality of address lines Ae-Ah of the internal address bus AB2 are connected to address pins AE-AH, respectively.

The operation of the semiconductor integrated circuit device of FIG. 12 will now be described. First, the master LSI 500 supplies a control signal CNT including a switching table TBL via the control signal line CL to the operational unit 101 in the LSI 100. The operational unit 101 generates a switching control signal SED based on the switching table TBL for supply to the switching circuit 102. In the switching circuit 102, each of the terminals a-d is connected to any of the terminals A-D based on the switching control signal SED.

After this, data signals are transmitted from the operational unit 101 in the LSI 100 to the semiconductor memory 201*b* in the LSI 200*b*. Concurrently, address signals are transmitted from the operational unit 101 in the LSI 100 to the semiconductor memory 201*b* in the LSI 200*b*. Thus, the data signals are read from or written to the semiconductor memory 201*b*.

In this manner, based on the switching table TBL supplied from the master LSI 500, the connection state between the terminals a-d and the terminals A-D in the switching circuit 102 can be arbitrarily switched. This allows the data signals on the external data bus DB0 to be different from the data signals on the internal data bus DB1 in the LSI 100.

Consequently, the security of the data signals on the internal data bus DB1 can be ensured, even if the third party pulls out the data signals from the data pins DA-DD in the LSI 100 or LSI 200. The security of the address signals on the internal address bus AB1 can also be ensured, even if the third party pulls out the address signals from the address pins AE-AH in the LSI 100 or LSI 200.

(10) Other Modifications

The semiconductor integrated circuit device of FIG. 8 may not necessarily be provided with the switching circuit 102 in the LSI 100 and the switching circuit 202 in the LSI 200. In the semiconductor integrated circuit device of FIG. 9, only the data signals in the LSI 100*a* and LSI 200*a* may be rearranged by the software or only the address signals may be rearranged by the software.

In the above embodiments, the LSIs 100, 200, 100*a*, 200*a*, 200*b* include the operational units 101, 201, 101*a*, 201*a*, and the semiconductor memory 201*b*, respectively; however, the LSIs 100, 200, 100*a*, 200*a*, 200*b* each may include any other kind of circuit than the one described above, such as a video signal processor or audio signal processor.

Alternatively, a circuit device may be formed by a combination of configurations or functions of the above first to ninth embodiments.

Although in the above embodiments the LSIs are used as the first and second semiconductor integrated circuits, any other semiconductor integrated circuits such as VLSIs or ICs may alternatively be used as the first and second semiconductor integrated circuits.

The invention claimed is:

1. A circuit device comprising:
a first semiconductor integrated circuit that has a plurality of first signal pins receiving a plurality of signals, and includes a first circuit performing processing with respect to said plurality of signals; and
a second semiconductor integrated circuit that has a plurality of second signal pins receiving said plurality of signals, and includes a second circuit performing processing with respect to said plurality of signals, wherein
said plurality of first signal pins and said plurality of second signal pins are interconnected,
said first semiconductor integrated circuit further includes a first correlation changing unit that changes a correlation between said plurality of signals in said first circuit and said plurality of first signal pins, and
said first correlation changing unit changes the correlation between said plurality of signals in said first circuit and said plurality of first signal pins on a regular or irregular basis.

2. The circuit device according to claim 1, wherein
said plurality of signals are data signals,
said plurality of first signal pins are a plurality of first data pins, and
said plurality of second signal pins are a plurality of second data pins.

3. The circuit device according to claim 1, wherein
said plurality of signals are address signals,
said plurality of first signal pins are a plurality of first address pins, and
said plurality of second signal pins are a plurality of second address pins.

4. The circuit device according to claim 1, wherein
said plurality of signals are a plurality of data signals and a plurality of address signals,
said plurality of first signal pins are a plurality of first data pins and a plurality of first address pins,
said plurality of second signal pins are a plurality of second data pins and a plurality of second address pins,
said plurality of first data pins and said plurality of second data pins are interconnected, while said plurality of first address pins and said plurality of second address pins are interconnected, and
said first correlation changing unit changes a correlation between said plurality of first data signals in said first circuit and said plurality of first data pins and a correlation between said plurality of first address signals in said first circuit and said plurality of first address pins.

5. The circuit device according to claim 1, further comprising a third semiconductor integrated circuit that transmits alteration information, and wherein
said first correlation changing unit changes a correlation between said plurality of signals in said first circuit and said plurality of first signal pins based on said alteration information transmitted by said third semiconductor integrated circuit.

6. A circuit device comprising:
a first semiconductor integrated circuit that has a plurality of first signal pins receiving a plurality of signals, and includes a first circuit performing processing with respect to said plurality of signals;
a second semiconductor integrated circuit that has a plurality of second signal pins receiving said plurality of signals, and includes a second circuit performing processing with respect to said plurality of signals; and
a third semiconductor integrated circuit that transmits alteration information via a signal line, wherein
said plurality of first signal pins and said plurality of second signal pins are interconnected,
said first semiconductor integrated circuit further includes a first correlation changing unit that changes a correlation between said plurality of signals in said first circuit and said plurality of first signal pins,
said first correlation changing unit changes the correlation between said plurality of signals in said first circuit and said plurality of first signal pins based on said alteration information transmitted by said third semiconductor integrated circuit, and
said third semiconductor integrated circuit performs an authentication operation based on voltage on said signal line before transmitting said alteration information.

7. The circuit device according to claim 1, wherein
said first semiconductor integrated circuit further includes a first storage that stores alteration information, and
said first correlation changing unit changes a correlation between said plurality of signals in said first circuit and said plurality of first signal pins based on said alteration information stored in said first storage.

8. The circuit device according to claim 1, wherein
said first circuit produces alteration information, and
said first correlation changing unit changes a correlation between said plurality of signals in said first circuit and said plurality of first signal pins based on said alteration information produced by said first circuit.

9. A circuit device comprising:
a first semiconductor integrated circuit that has a plurality of first signal pins receiving a plurality of signals, and includes a first circuit performing processing with respect to said plurality of signals; and
a second semiconductor integrated circuit that has a plurality of second signal pins receiving said plurality of signals, and includes a second circuit performing processing with respect to said plurality of signals, wherein
said plurality of first signal pins and said plurality of second signal pins are interconnected,
said first semiconductor integrated circuit further includes a first correlation changing unit that changes a correlation between said plurality of signals in said first circuit and said plurality of first signal pins, and
said first correlation changing unit decrypts alteration information that has been encrypted in advance, to change the correlation between said plurality of first signals in said first circuit and said plurality of first signal pins based on the decrypted alteration information.

10. A circuit device comprising:
a first semiconductor integrated circuit that has a plurality of first signal pins receiving a plurality of signals, and includes a first circuit performing processing with respect to said plurality of signals;
a second semiconductor integrated circuit that has a plurality of second signal pins receiving said plurality of signals, and includes a second circuit performing processing with respect to said plurality of signals; and
a third semiconductor integrated circuit that transmits alteration information, wherein
said plurality of first signal pins and said plurality of second signal pins are interconnected,
said first semiconductor integrated circuit further includes a first correlation changing unit that changes a correlation between said plurality of signals in said first circuit and said plurality of first signal pins,
said second semiconductor integrated circuit further includes a second correlation changing unit that changes a correlation between said plurality of signals in said second circuit and said plurality of second signal pins,
said first correlation changing unit changes the correlation between said plurality of signals in said first circuit and said plurality of first signal pins based on said alteration information transmitted by said third semiconductor integrated circuit, and
said second correlation changing unit changes the correlation between said plurality of signals in said second circuit and said plurality of second signal pins based on said alteration information transmitted by said third semiconductor integrated circuit.

11. A circuit device comprising:
a first semiconductor integrated circuit that has a plurality of first signal pins receiving a plurality of signals, and includes a first circuit performing processing with respect to said plurality of signals; and
a second semiconductor integrated circuit that has a plurality of second signal pins receiving said plurality of signals, and includes a second circuit performing processing with respect to said plurality of signals, wherein
said plurality of first signal pins and said plurality of second signal pins are interconnected,
said first semiconductor integrated circuit further includes a first correlation changing unit that changes a correlation between said plurality of signals in said first circuit and said plurality of first signal pins,
said first correlation changing unit changes the correlation between said plurality of signals in said first circuit and said plurality of first signal pins based on alteration information,
said second semiconductor integrated circuit further includes a second correlation changing unit that changes a correlation between said plurality of signals in said second circuit and said plurality of second signal pins,
said first semiconductor integrated circuit transmits said alteration information to said second semiconductor integrated circuit, and
said second correlation changing unit changes the correlation between said plurality of signals in said second circuit and said plurality of second signal pins based on said alteration information transmitted by said first semiconductor integrated circuit.

12. The circuit device according to claim 1, wherein
said first correlation changing unit includes:
a plurality of first terminals connected to said first circuit;
a plurality of second terminals connected to said plurality of first signal pins; and
a switching circuit that changes a connection state between said plurality of first terminals and said plurality of second terminals.

13. The circuit device according to claim 1, wherein
said first correlation changing unit includes a program for rearranging said plurality of signals for use in the processing by said first circuit.

14. An operation method for a circuit device comprising first and second interconnected semiconductor integrated circuits, the method comprising:
- transmitting a plurality of signals between a plurality of first signal pins and a first circuit in said first semiconductor integrated circuit;
- transmitting said plurality of signals between a plurality of second signal pins and a second circuit in said second semiconductor integrated circuit;
- transmitting said plurality of signals between said plurality of first signal pins and said plurality of second signal pins; and
- changing a correlation between said plurality of signals in said first circuit and said plurality of first signal pins on a regular or irregular basis.

15. A method of operating a circuit device which comprises a first semiconductor integrated circuit that has a plurality of first signal pins which receive a plurality of signals and includes a first circuit which performs processing with respect to said plurality of signals, and a second semiconductor integrated circuit that has a plurality of second signal pins interconnected with said plurality of first signal pins which receive said plurality of signals and includes a second circuit which performs processing with respect to said plurality of signals, the method comprising:
- changing a correlation between said plurality of signals in said first circuit and said plurality of first signal pins on a regular or irregular basis.

* * * * *

UNITED STATES PATENT AND TRADEMARK OFFICE
CERTIFICATE OF CORRECTION

PATENT NO.       : 7,446,413 B1
APPLICATION NO.  : 10/514237
DATED            : November 4, 2008
INVENTOR(S)      : Moriie It is certified that error appears in the above-identified patent and that said Letters Patent is hereby corrected as shown below:

On the cover page, Item (87), PCT Pub. No. "WO01/86654" should be --WO03/098443--

On the cover page, Item (87), PCT Pub. Date "Nov. 15, 2001" should be --Nov. 27, 2003--

On the cover page, Item (56), Foreign Patent Documents "GB 2315575 4/1998" should be --GB 2315575 2/1998--

Signed and Sealed this

Twenty-second Day of December, 2009

David J. Kappos
*Director of the United States Patent and Trademark Office*